United States Patent [19]
Hagihara

[11] Patent Number: 5,825,192
[45] Date of Patent: Oct. 20, 1998

[54] PROBE CARD DEVICE USED IN PROBING APPARATUS

[75] Inventor: Junichi Hagihara, Kofu, Japan

[73] Assignee: Tokyo Electron Limited, Tokyo, Japan

[21] Appl. No.: 679,333

[22] Filed: Jul. 11, 1996

[30] Foreign Application Priority Data

Jul. 14, 1995 [JP] Japan ................................ 7-178543
Nov. 30, 1995 [JP] Japan ................................ 7-312198

[51] Int. Cl.⁶ .................................................. G01R 1/073
[52] U.S. Cl. ............................................................ 324/757
[58] Field of Search .................................. 324/754, 755, 324/758, 765, 757

[56] References Cited

U.S. PATENT DOCUMENTS

| | | | |
|---|---|---|---|
| 4,906,920 | 3/1990 | Huff et al. | 324/754 |
| 4,980,637 | 12/1990 | Huff et al. | 324/754 |
| 5,339,027 | 8/1994 | Woith et al. | 324/754 |
| 5,497,103 | 3/1996 | Ebert et al. | 324/754 |
| 5,563,521 | 10/1996 | Crumly | 324/754 X |
| 5,604,446 | 2/1997 | Sano | 324/758 |
| 5,672,977 | 9/1997 | Yamada | 324/754 |

*Primary Examiner*—Michael Brock
*Attorney, Agent, or Firm*—Oblon, Spivak, McClelland, Maier, Neustadt, P.C.

[57] ABSTRACT

A probe card device used in a probing apparatus for testing the electrical characteristics of a semiconductor wafer by bringing bump electrodes into contact with a plurality of electrode pads of the wafer comprises a probe card, a support block for supporting the probe card, and a pushing mechanism for pushing the probe card toward the wafer. The pushing mechanism includes a pushing member divided into a plurality of blocks, and a support member for supporting each of the divided blocks. These plural blocks are movable independently and serve to push the wafer in a manner to follow a surface profile of the wafer.

10 Claims, 4 Drawing Sheets

PROBE CARD DEVICE USED IN PROBING APPARATUS

BACKGROUND OF THE INVENTION

1. Field of the Invention

The present invention relates to a probe card device used in a probing apparatus for testing electrical characteristics of an object to be tested such as a semiconductor device.

2. Description of the Related Art

In the manufacture of a semiconductor device, a large number of semiconductor devices are formed on a semiconductor wafer by using, for example, a precision photographic transferring technology, followed by cutting the wafer into individual semiconductor devices. In the manufacturing process of such a semiconductor device, the electrical characteristics of the semi-finished semiconductor device are measured in general by using a probing apparatus. Of course, the semiconductor devices which have been found to be satisfactory by the probing test are selectively transferred to subsequent processes such as a packaging process so as to improve the productivity.

A probing apparatus of this type comprises a table, which is movable in an X–Y–Z–θ direction, for supporting thereon a semiconductor wafer as an object to be tested. A probe card provided with a large number of probing needles corresponding to electrode pads of a semiconductor chip formed in the semiconductor wafer is arranged above the table. In measuring the electrical characteristics of the semiconductor devices, the semiconductor wafer is disposed on the table. Under this condition, the position of the table is adjusted so as to bring the probing needles of the probe card into contact with the electrode pads of the semiconductor wafer. Of course, the electrical characteristics are measured through these probing needles by using a tester.

In recent years, the semiconductor devices are rendered finer and finer. Also, the degree of integration of the electrical circuits is made higher and higher. Naturally, the size of the electrode pad is made smaller, and the distance between adjacent pads is made shorter. For example, the electrode pad of a semiconductor device is sized nowadays at 60×60 μm to 100×100 μm. Also, the electrode pads are arranged to form a row at a pitch of 100 to 200 μm. It follows that hundreds of probing needles are required to be mounted in a limited space of the probe card. Naturally, it is technically difficult to prepare a probe card meeting the particular requirement.

As a measure for overcoming the above-noted difficulty, proposed in Japanese Patent Disclosure (Kokai) Nos. 2-126159 and 2-163664 is a so-called membrane type probe card prepared by mounting a plurality of electrode bumps to a membrane having a predetermined wiring pattern formed thereon in advance. To be more specific, the probing apparatus disclosed in Japanese Patent Disclosure No. 2-126159 comprises a membrane member provided with a large number of electrode bumps and stretched to cover an annular movable frame. The peripheral portion of the membrane member is supported by a support member, and a leaf spring is disposed between the support member and the annular movable frame. Also, a cushioning member is attached to the back surface of the membrane member such that a difference in height among the electrode pads of a semiconductor wafer is absorbed by the cushioning member. In the testing step, the membrane member and the annular movable frame are moved integrally in a vertical direction against the elastic force of the leaf spring so as to bring the electrode bumps into elastic contact with the electrode pads of the wafer.

The probing apparatus disclosed in Japanese Patent Disclosure No. 2-163664 is substantially equal to that disclosed in No. '159 described above, except that, in No. '664, a swingable plate is mounted on the back side of the membrane member. In this apparatus, the swingable plate is rotated in the case where the wafer and the membrane member are not in parallel with each other in the testing step so as to make gradually the membrane member parallel with the wafer, thereby to achieve an elastic contact therebetween.

In a probing apparatus using a membrane type probe card described above, there is a proposal to increase the size of the probe card so as to permit the electrode pads of a large number of chips to be collectively brought into contact with the electrode bumps of the probe card and, thus, to improve the testing efficiency.

In any of the conventional probing apparatuses outlined above, it is certainly possible to allow a plurality of electrode bumps to be brought into contact with the corresponding electrode pads without fail as far as the electrode pads of a single semiconductor chip are concerned. However, if the electrode pads of a large number of chips are to be brought into contact at once with the corresponding bumps, the required contact area is excessively large, making it difficult to dispose the wafer such that the wafer is accurately parallel with the surface of the probe card. As a result, it is difficult to bring all the electrode pads into contact with the electrode bumps without fail. It is also difficult to apply pressure uniformly to the contact points of all the electrode bumps.

SUMMARY OF THE INVENTION

An object of the present invention is to provide a probe card device used in a probing apparatus, the probe card device permitting all the contact elements to be brought into contact with electrode pads without fail and also permitting application of a substantially uniform pressure to the contact points of all the contact elements, even where electrode pads arranged over a large area are to be brought into contact with contact members as in the case where the electrode pads of a plurality of semiconductor chips formed on a semiconductor wafer are collectively brought into contact with the contact elements.

According to a first aspect of the present invention, there is provided a probe card device used in a probing apparatus for testing the electrical characteristics of an object to be tested having a plurality of electrode pads by bringing the electrode pads into contact with contact elements, comprising:

a probe card disposed to face the object, the probe card including a flexible and insulating membrane having a pushing region, a plurality of contact members mounted in the pushing region of the membrane in a manner to correspond to a plurality of electrode pads of the object, and a wiring formed in the membrane for achieving an electrical contact between a tester of the probing apparatus and the contact members;

a support member for supporting the probe card; and a pushing mechanism for pushing the back surface in the pushing region of the membrane included in the probe card toward the object;

wherein the pushing mechanism includes a pushing member divided into a plurality of blocks to correspond to the pushing region and a support member for supporting each block, the plural blocks of the pushing member being independently movable, and the plural blocks serving to push the object in a manner to follow a surface profile of the object.

According to a second aspect of the present invention, there is provided a probe card device used in a probing apparatus for testing the electrical characteristics of an object to be tested having a plurality of electrode pads by bringing the electrode pads into contact with contact elements, comprising:

a probe card including a flexible and insulating membrane, and contact elements which are to be brought into contact with a plurality of electrode pads of the object in a manner to correspond to the plural electrode pads; and a pushing mechanism for pushing the back surface of the probe card toward the object;

wherein the pushing mechanism includes a pushing member mounted on the back surface of the probe card, an elastic sheet mounted to the pushing member in a manner to face the back surface of the probe card, and a plurality of pushing sections partitioned by cutting on a surface of the elastic sheet in a manner to correspond to the contact elements.

The probe card device according to the first aspect of the present invention comprises a pushing mechanism for pushing the back surface in a main region the membrane included in the probe card toward the object. What should be noted is that the pushing mechanism includes a pushing member divided into a plurality of blocks to correspond to the pushing region and a support member for supporting each block. These divided blocks of the pushing member are independently movable so as to push the object to be tested in a manner to follow a surface profile of the object. It follows that the contact elements can be brought into contact without fail with the electrode pads arranged over a large area of the object to be tested, and that a substantially uniform pressure can be applied to all the contact points of the contact members, even where electrode pads arranged over a large area are to be brought into contact with contact members as in the case where the electrode pads of a plurality of semiconductor chips formed on a semiconductor wafer are collectively brought into contact with the contact members.

The probe card device according to the second aspect of the present invention also comprises a pushing mechanism for pushing the back surface of the probe card toward the object to be tested. What should be noted is that the pushing mechanism includes a plurality of pushing sections partitioned by cutting on a surface of an elastic sheet formed on the back surface of the probe card. Since the pushing sections can be independently deformed elastically to conform with the contact elements, the elastic sheet is deformed in accordance with a surface profile of the object to be tested. It follows that the contact elements can be brought into contact without fail with the electrode pads, even where the contact elements are to be brought into contact with the electrode pads formed on an object having a large area. Of course, a substantially uniform pressure can be applied to all the contact points of the contact elements.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Figure 1:
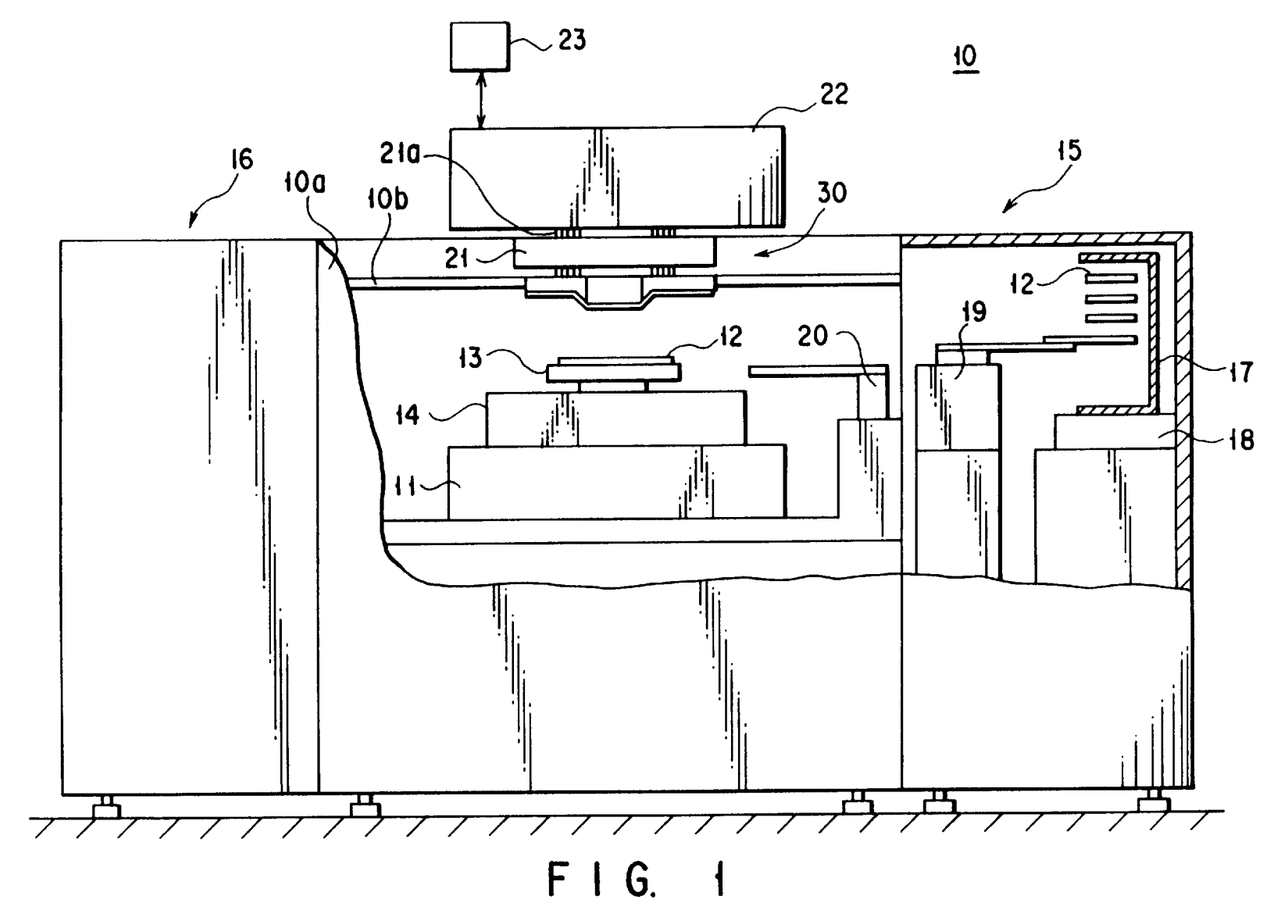
FIG. 1 schematically shows the construction of a probing apparatus in which is used a probe card device according to a first embodiment of the present invention.

Let us describe a probe card device according to a preferred embodiment of the present invention with reference to the accompanying drawings. Specifically, FIG. 1 schematically shows the construction of a probing apparatus 10 in which is used a probe card device according to a preferred embodiment of the present invention. As shown in the drawing, the probing apparatus 10 comprises a housing 10a. A main stage 11 is arranged in a central region of the housing 10a. A table 13 on which a semiconductor wafer 12 is disposed is mounted on the main stage 11. The table 13 can be moved in x–, y–, z–directions and can be rotated by a moving mechanism 14 arranged below the table 13.

A probe card device 30 of the present invention, which is positioned above the table 13, is mounted to a head plate 10b of the probing apparatus 10 in a manner to face the semiconductor wafer 12. The probe card device 30, which is used for the probing of the semiconductor wafer 12, will be described later in detail.

An alignment device (not shown) is disposed in front of the central portion of the probing apparatus 10. A picture image recognizing device for alignment such as a camera is mounted in the alignment unit. When taking alignment, the table 13 is moved to a position below the camera.

An auto loader 15 for transferring the semiconductor wafer 12 into or out of the probing apparatus 10 is arranged on the right-hand side in the drawing of the probing apparatus 10. Inside the auto loader 15, a wafer cassette 17, in which a number of semiconductor wafers 12 are arranged a predetermined distance apart from each other in a vertical direction, is exchangeably mounted on a cassette substrate 18. A loader stage 19 movable within a horizontal plane and a wafer handling arm 20, which can be driven by an Y–direction driving mechanism (not shown) and an X–direction driving mechanism (not shown), are located between the wafer cassette 17 and the table 13.

A probe card exchanger 16 is disposed on the left-hand side in the drawing of the probing apparatus 10. A plurality of different kinds of probe cards are housed in the probe card exchanger 16 so as to carry out an exchange function of probe cards, as required.

A contact ring 21 and a test head 22 are removably mounted in an upper portion of the probe card device 30. Also, a tester 23 is connected to the test head 22. The contact ring 21 includes an electrically conductive pin 21a projecting both downward and upward so as to permit the probe card device 30 to be electrically connected to the test head 22. The tester 23 serves to apply a power supply voltage or testing pulse signal to a plurality of semiconductor chips 12b (FIG. 2) formed on the semiconductor wafer 12 and takes in an output signal on the side of the chip so as to determine whether or not the chip is satisfactory.

When the semiconductor wafer 12 is tested by using the probe card device 30, the semiconductor wafer 12 is transferred by the loader stage 19 to a position near the table 13 and, then, disposed on the table 13 by the handling arm 20. Further, the semiconductor wafer 12 is fixed to the table 13 by a chuck (not shown). Under this condition, probing is applied to the wafer 12 by the probe card device 30. After the test, the semiconductor wafer 12 is transferred again onto the loader stage 19 by the handling arm 20. Further, the wafer 12 is transferred by the loader stage 19 into the wafer cassette 17.

It is possible to dispose a monitoring device such as a microscope or a camera, as required, above the tester 22 positioned in the upper portion of the probing apparatus 10. Alternatively, a camera may be disposed to face upward on the table 13 having the semiconductor wafer 12 (object to be tested) disposed thereon so as to monitor the probing needles.

Figure 2:
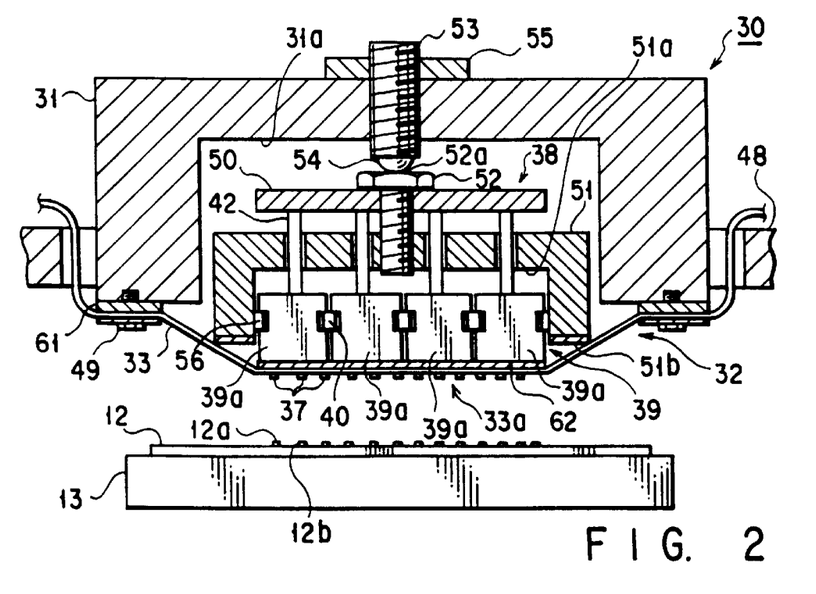
FIG. 2 is a cross sectional view showing the probe card device according to the first embodiment of the present invention.

FIG. 2 shows in detail the probe card device 30 according to a first embodiment of the present invention. As shown in the drawing, the probe card device 30 comprises a membrane type probe card 32, a support block 31 for supporting the probe card 32, a pushing mechanism 38 for pushing the probe card 32 toward the semiconductor substrate 12, i.e., object to be tested, and a printed wiring board 48.

The printed wiring board 48 is fitted in a recessed portion, which is positioned to face the table 13, of the head plate 10b of the probing apparatus 10 so as to be fixed to the head plate 10b. It should be noted that the printed wiring board 48 comprises a hard resin substrate and a wiring pattern formed on a surface of the resin substrate. Of course, an electrical connection between the probe card 32 and the contact ring 21 can be achieved by the wiring pattern of the printed wiring board 48.

On the other hand, the support block 31 is fitted in a recessed portion of the wiring substrate 48 and fixed in this state to the wiring substrate 48. A concavity 31a is formed in a central portion in a lower surface of the support block 31. As seen from the drawing, the probe card 32 is fixed by a bolt 49 to the lower surface of the support block 31 in a manner to close the concavity 31a.

The pushing mechanism 38, which is arranged within the concavity 31a of the support block 31, comprises a tension imparting block 51 serving to impart tension to the probe card 32, and a pushing member 39 divided into a plurality of blocks 39a. A recess 51a, in which the pushing member 39 is arranged, is formed in a central portion in the lower surface of the tension imparting block 51.

Figure 3:
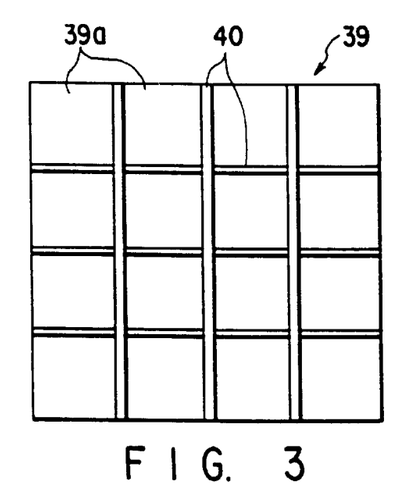
FIG. 3 schematically shows the arrangement of blocks of the pushing member included in the probe card device according to the first embodiment of the present invention.

As shown in FIG. 3, the pushing member 39, which serves to impart a pushing force to the probe card 32, is divided in a lattice form into the plural blocks 39a (16 blocks in the drawing) to conform with pushing regions 33a (FIG. 2). These blocks 39a are joined to each other via leaf springs 40 arranged between adjacent blocks 39a to form a lattice.

Figure 4:
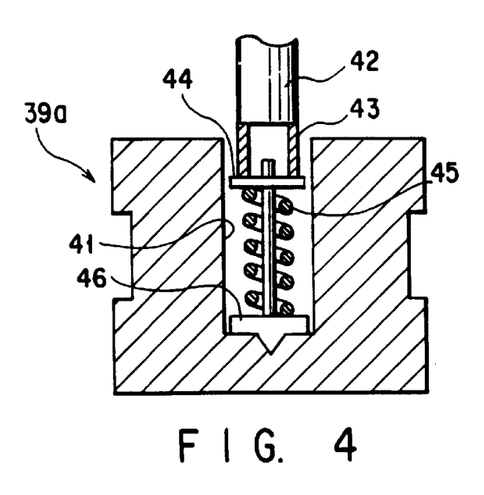
FIG. 4 is a cross sectional view showing one of the blocks of the pushing member included in the probe card device according to the first embodiment of the present invention.

Each block 39a is supported by a support member 50 via a support rod 42. As shown in FIG. 4, a recess 41 is formed in a central portion of the block 39a. A spring holding member 46 having a lower end of a coil spring 45 fixed thereto is mounted within the recess 41. On the other hand, an upper end of the coil spring 45 is fixed to a moving plate 44 which is moved up and down in accordance with the elongation/shrinkage of the coil spring 45. Further, the moving plate 44 is joined to the support rod 42 via a cylindrical member 43. It follows that each block 39a is elastically moved up and down by the urging force of the coil spring 45. Incidentally, the clearance between adjacent blocks 39a is set at about 0.1 mm. Also, a stopper 56 is mounted inside a side surface of the tension imparting block 51. When pushed upward, the block 39a positioned at an end of the pushing member 39 is engaged with the stopper 56.

An externally threaded bolt 52 projects downward from above the support member 50 through internally threaded hole extending through the central portions of the support member 50 and the tension imparting block 51. The position of the pushing member 39 relative to the tension imparting block 51 is determined in advance by adjusting the bolt 52.

Further, an externally threaded bolt 53 projects downward from above the support block 31 through an internally threaded hole extending through the central portion of the support block 31. A ball 54 made of a material having an excellent abrasion resistance such as ceramics or ruby is pushed into and fixed to the lower end of the bolt 53. The lower end of the ball 54 abuts against a recess 52a formed in a head portion of the bolt 52. It should be noted that the ball 54 permits the pushing member 39 to be swingable. The position of the tension imparting block 51 is determined in advance by adjusting the bolt 53. Further, a nut 55 serving to fix the bolt 52 and the support block 31 is engaged with an upper portion of the bolt 53.

If the bolt 53 is rotated so as to be moved downward, the tension imparting block 51 is pushed downward. Likewise, if the bolt 52 is rotated so as to be moved downward, the support member 50 and the pushing member 39 are pushed downward. It should be noted that the bolt 53 pushes downward the tension imparting block 51 so as to determine the position of the block 51 so as to adjust the tension of the probe card 32, thereby to allow the probe card 32 to be sufficiently flat. On the other hand, the bolt 52 serves to push downward the pushing member 51 so as to adjust a pushing load of a bump electrode 37, which will be described later, of the probe card 32. The pushing distance of the tension imparting block 51 is set at, for example, 0.8 mm. Also, the pushing distance of the pushing member 51 is set at, for example, 0.2 mm. Since the probe card 32 is tensioned in two stages in this fashion, the tension of the probe card is made uniform so as to allow the probe card to be sufficiently flat.

Figure 5:
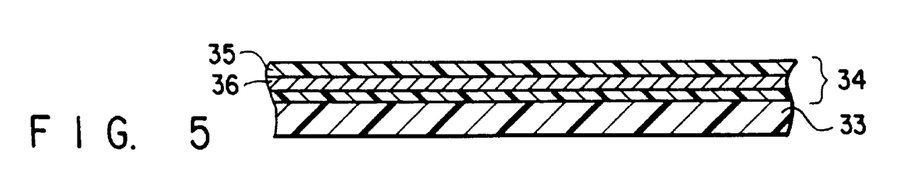
FIG. 5 is a cross sectional view showing the construction of a probe card included in the probe card device of the present invention.

As shown in FIG. 5, the probe card 32 is of a laminate structure consisting of a flexible insulating membrane 33 made of a polyimide resin, a silicone resin, etc., and a flexible printed circuit 34 prepared by laminating a wiring layer 36 made of copper, a copper alloy, etc. on a resin sheet 35. Further, a plurality of bump electrodes 37 acting as contact elements are formed on the probe card of the construction described above. These bump electrodes 37 extend downward from pushing regions 33a of the membrane 33. These pushing regions 33a are positioned to correspond to the semiconductor wafer 12 disposed on the table 13. Further, a frame body 61 is interposed at a fixing portion between the probe card 32 and the support block 31. As described previously, the bolt 53 is adjusted to allow the lower end of the tension imparting block 51 to be pressed against the membrane 33, thereby imparting tension to the probe card 32. It should be noted that a silicone rubber layer 51b having a Teflon coating applied to the surface is formed on the lower surface of the tension imparting block 51 in direct contact with the membrane 33. In this case, the silicone rubber layer acts as a cushioning material. In addition, the tension in every direction is stabilized because the Teflon coating permits sliding of the silicone rubber layer 51b.

An elastomer layer 62 made of, for example, a silicone rubber as an elastic member is interposed between the pushing region 33a of the probe card 32 and the pushing member 39. The surface of the elastomer 62 is coated with a lubricating material such as Teflon. The elastomer layer 62 is substantially equal in size to the pushing region 33a and serves to absorb small differences in vertical length among the bump electrodes 37 when the bump electrodes 37 are brought into contact with the electrode pads 12a, with the result that the tips of the bump electrodes 37 are positioned substantially in a horizontal plane.

In actually performing the inspection, the probe card 32 and the semiconductor wafer 12 disposed on the table 13 are positioned such that the pushing region 33a of the membrane 33 of the probe card 32 is allowed to face the semiconductor wafer 12. In the embodiment of the present invention shown in the drawings, the pushing region 33a has a large area such that a plurality of pad electrodes 12a corresponding to a plurality of semiconductor chips 12b formed on the semiconductor wafer 12 are simultaneously subjected to the probing operation.

The probing apparatus of the construction described above is operated as follows. In the first step, the semiconductor wafer 12 inside the wafer cassette 17 is held by the handling arm 20 so as to be transferred onto the table 13 of the main stage 11. In this step, the bolt 53 is adjusted so as to adjust the tension of the probe card 32, thereby to allow the probe card 32 to be sufficiently flat. Also, the bolt 52 is adjusted so as to adjust the pushing load of the bump electrodes 37. Then, the semiconductor wafer 12 is fixed to the table 13 by a chuck (not shown), followed by moving the table 13 by a moving mechanism 14. Further, the table 13 is moved upward so as to bring the electrode pad 12a of the semiconductor chip into contact with the bump electrode 37 acting as a contact element of the probe card 32, thereby aligning the probe card 32 and the semiconductor wafer 12 in a horizontal direction.

It should be noted that many semiconductor chips, e.g., 64 chips, are formed on a single semiconductor wafer. In the present invention, the pushing region 33a of the membrane 33 included in the probe card 32 is allowed to correspond to a plurality of chips formed on the semiconductor wafer 12. Because of the particular construction, the position of the pushing region 33a and the positions of the plural semiconductor chips corresponding to the particular pushing region 33a are determined by the moving mechanism 14. Since the bump electrodes are brought into contact with the electrode pads of a plurality of semiconductor chips, it was difficult in the past to bring all the bump electrodes collectively into contact with the electrode pads. In the present invention, however, the pushing member 39 serving to push the pushing region 33a is divided into a plurality of blocks 39a, as shown in FIG. 2. These blocks 39a are movable independently. Further, an elastic force is imparted by the coil spring 45 to these blocks 39a. It follows that the semiconductor wafer 12 is uniformly pushed by the plural blocks 39a which are movable independently, with the result that the semiconductor wafer 12 is pushed to follow a surface profile of the semiconductor wafer 12. As a result, the bump electrodes 37 acting as contact elements can be brought into contact without fail with the electrode pads 12a of the semiconductor wafer 12, even where a contact area is large as in the case where the bump electrodes are collectively brought into contact with electrode pads of a plurality of semiconductor chips formed on the semiconductor wafer 12. In addition, a substantially uniform pressure can be applied to the contact points of all the contact elements.

As described previously, the ball 54 is mounted to the tip of the bolt 53 so as to swingably support the pushing member 39. As a result, it is possible for the probe card 32 to follow the semiconductor wafer 12 without difficulty even if the probe card 32 is inclined relative to the semiconductor wafer 12.

Further, the elastomer layer 62 made of, for example, a silicone rubber is interposed between the main region 33a of the membrane 33 included in the probe card 32 and the pushing member 39. What should be noted is that the surface of the elastomer layer 62 is coated with a lubricating material such as Teflon. Because of the particular construction, small difference in vertical length among the bump electrodes 37 is absorbed by the elastomer layer 62 when the bump electrodes 37 are brought into contact with the electrode pads 12a. It follows that the tips of the bump electrodes 37 are substantially aligned in a horizontal plane.

Still further, the tensing of the probe card 32 is adjusted in two stages by the bolts 52 and 53 in the embodiment described above. However, it is of course possible to employ a single stage tensing in place of the tensing in two stages. What should also be noted is that the number of pushing members is not particularly limited in the present invention.

Figure 6:
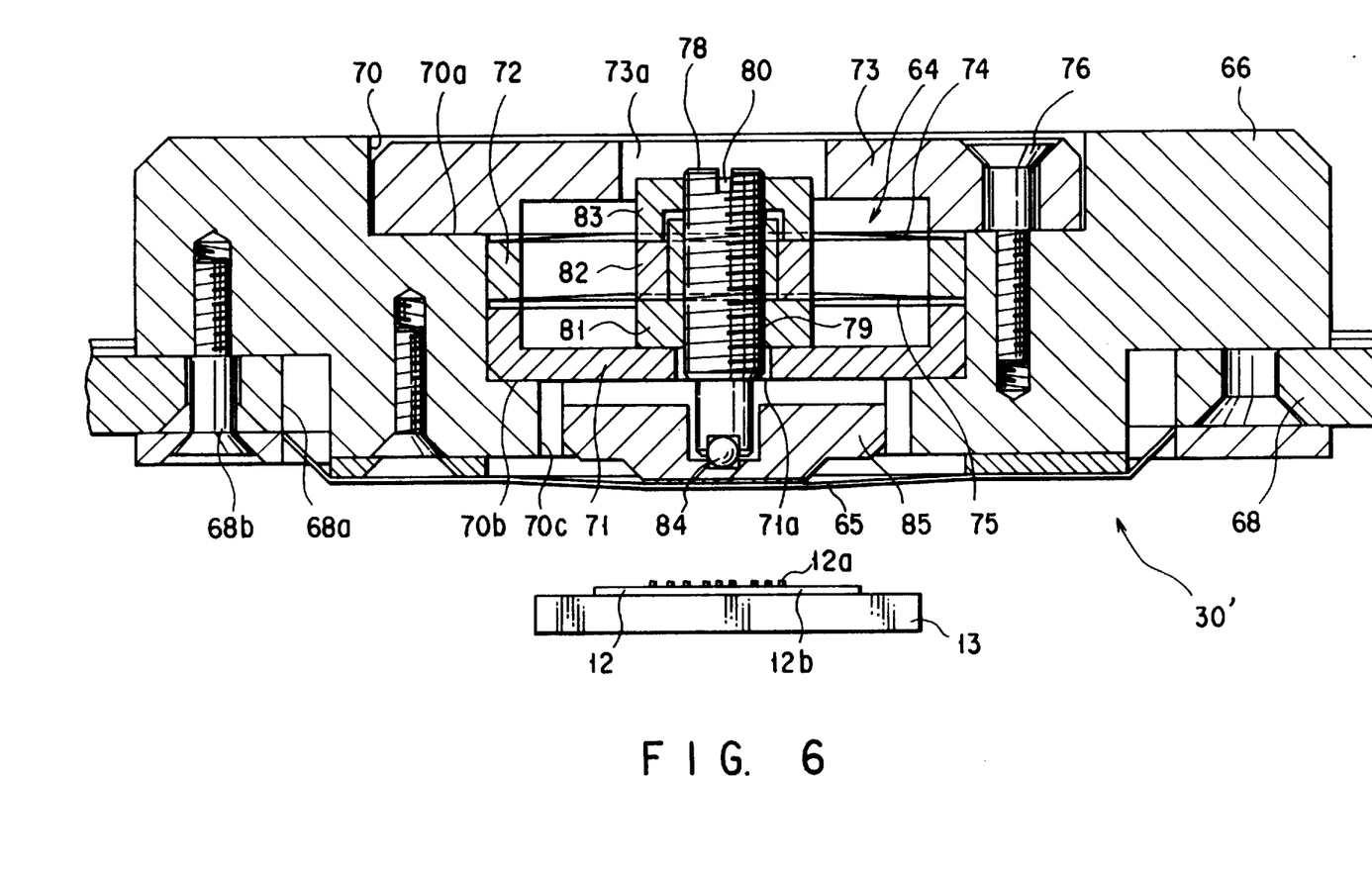
FIG. 6 is a cross sectional view showing a probe card device according to a second embodiment of the present invention.

FIG. 6 shows a probe card device 30' according to the second embodiment of the present invention. As shown in the drawing, the probe card device 30' comprises a membrane type probe card 65, a support member 66 for supporting the probe card 65, a pushing mechanism 64 for pushing the probe card 65 toward the semiconductor wafer 12 used as an object to be tested, and a printed wiring board 68.

The probe card 65 consists of a flexible printed circuit board prepared by laminating a resin sheet having a wiring pattern of copper, a copper alloy, etc. formed therein on a flexible insulating membrane formed of, for example, a polyimide resin or a silicone resin. A plurality of contact bumps 65a are formed on the lower surface of the probe card 65 in a manner to correspond in the number of arrangement to the electrode pads mounted to a plurality of semiconductor chips 12b formed on the semiconductor wafer 12.

The printed wiring board 68 is fitted in a hole formed in a position to face the substrate 13 of the probing apparatus 10 so as to be fixed to the head plate 10b. In this embodiment, the printed wiring board 68 comprises a hard resin substrate and a wiring pattern formed on the surface of the resin substrate. Naturally, the wiring pattern permits an electrical connection between the probe card 65 and the electrode pads 12a of the semiconductor wafer 12.

On the other hand, the support member 66 is fitted in an opening 68a formed in the printed wiring board 68 and fixed to the printed circuit board 68 by a bolt 68b. A recess 70 is formed in a central portion of the upper surface of the support member 66. As shown in the drawing, two stages differing from each other in depth, i.e., an upper stage 70a and a lower stage 70b, are formed in those portions which correspond to the bottom of the recess 70 of the support member 66. Further, an opening 70c is formed in the bottom of the recess 70. Still further, a pushing mechanism 64 is formed in the recess 70 and the opening 70c.

The pushing mechanism 64 comprises a lower support member 71 supported by the lower stage 70b of the support member 66 and an intermediate support member 72 arranged above the lower support member 71. An upper support member 73, which is supported by the upper stage 70a, is arranged above the intermediate support member 72. Further, a leaf spring 74 is interposed between the upper support member 73 and the intermediate support member 72. Likewise, a leaf spring 75 is interposed between the lower support member 71 and the intermediate support member 72. The circumferential peripheral portions of the leaf spring 74 are held between the upper support member 73 and the intermediate support member 72 so as to be fixed such that the leaf spring 74 is shaped arcuate and urged upwardly. Also, the circumferential peripheral portions of the leaf spring 75 are held between the lower support member 71 and the intermediate support member 72 so as to be fixed such that the leaf spring 75 is shaped arcuate and urged upwardly.

The peripheral portion of the upper support member 73 is fastened to the support member 66 by a bolt 76.

As a result, the lower support member 71 and the intermediate support member 72 are simultaneously fixed to the support member 66.

A small opening 71a is formed in a central portion of the lower support member 71. Also, a large opening 73a is formed in a central portion of the upper support member 73 in a manner to face the small opening 71a. As shown in FIG. 6, an adjusting screw 78 acting as a tension adjusting means of the probe card extends in a vertical direction through these openings 71a and 73a.

Of course, the adjusting screw 78 is externally threaded to form a threaded portion 79. Also, a groove 80 is formed on the upper surface of the adjusting screw 78 for engagement with, for example, a screw driver. Further, a lower ring 81, which is internally threaded, is formed in the lower surface of the lower leaf spring 75. Of course, the externally threaded portion 79 of the adjusting screw 78 is engaged with the internally threaded lower ring 81.

An intermediate ring 82, which is internally threaded so as to be engaged with the externally threaded portion 79 of the adjusting screw 78, is arranged between the upper and lower leaf springs 74 and 75. Further, an upper ring 83, which is internally threaded so as to be engaged with the externally threaded portion 79 of the adjusting screw 78, is arranged on the upper surface of the upper leaf spring 74. It follows that the adjusting screw 78 is elastically supported by the two leaf springs 74, 75 in a vertical direction relative to the support member 66.

The lower end portion of the adjusting screw 78 projects downward through a lower support member 71. As seen from the drawing, a ball 84 excellent in abrasion resistance and having a high hardness, which is made of, for example, a ceramic material or ruby, is embedded in a lower tip portion of the adjusting screw 78 such that the ball 84 is allowed to partly project outward. As a result, a pushing member 85 is supported swingable about the ball 84.

Figure 7:
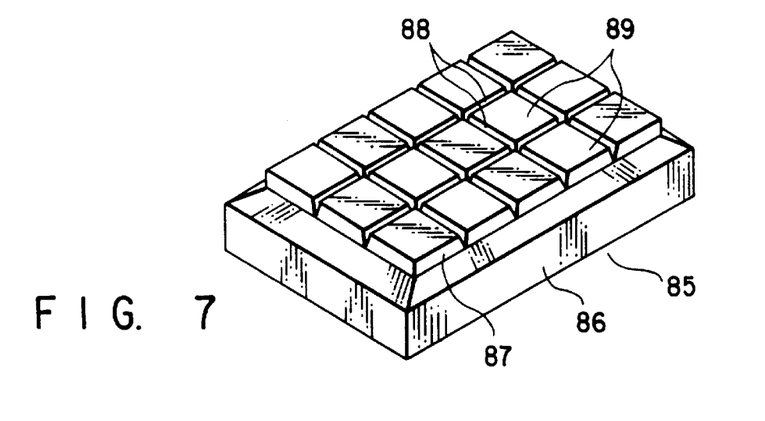
FIG. 7 is an oblique view showing the pushing member included in the probe card device shown in FIG. 6.
Figure 8:
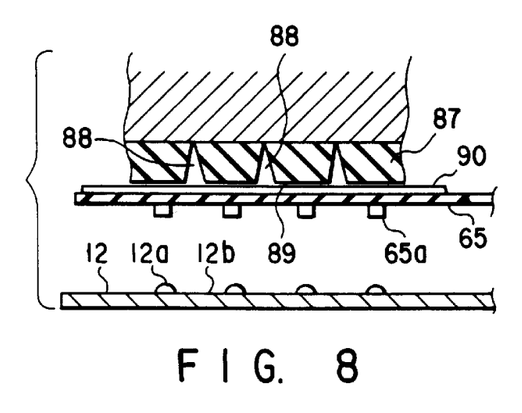
FIG. 8 is a vertical cross sectional view showing the pushing member included in the probe card device shown in FIG. 6.

FIGS. 7 and 8 collectively show the pushing member 85. As seen from these drawings, the pushing member 85 comprises an aluminum plate 86 as a substrate and a rectangular elastomer layer 87 fixed to the substrate 86. The elastomer layer 87 consists of an elastic sheet made of a cushioning material such a silicone rubber. A V-shaped groove 88 is formed on the surface of the elastomer layer 87, i.e., on the side facing the back surface of the probe card 65. The V-shaped groove 88 is in a lattice shape such that the elastomer layer 87 is partitioned by the groove 88 to form a plurality of rectangular pushing sections 89.

The pushing sections 89 are positioned to correspond respectively to contact bumps 65a of the probe card 65. In other words, the single elastomer layer 87 is partitioned by the groove 88 to form a plurality of pushing sections 89 which individually perform a cushioning function. The depth of the groove 88 should be equal to or substantially equal to the thickness of the elastomer layer 87. Since the groove 88 has a V-shaped cross section, the pushing section 89 is trapezoid. It follows that the groove 88 permits the pushing section 89 to be deformed effectively, when the pushing section 89 is pushed.

Further, a pushing area 89 on the surface of the elastomer layer 87 is covered with a Teflon sheet 90. The Teflon sheet 90 performs the function of a cushioning material together with the elastomer layer 87. In addition, the Teflon sheet 90 permits sliding of the pushing section 89. As a result, the tension is stabilized in every direction. Further, the ball 84 at the tip of the adjusting screw 78 allows a plurality of the contact bumps 65a of the probe card 65 to slidably abut against the electrode pads of the semiconductor wafer 12 disposed on the table 13. Incidentally, it is possible to coat the surface of the pushing section 89 with Teflon in place of using the Teflon sheet 90.

The probing apparatus using the probe card device according to the second embodiment of the present invention is operated as follows. In the first step, the semiconductor wafer 12 inside the wafer cassette 17 is held by the handling arm 20 and, then, transferred onto the table 13 of the main stage, as in the first embodiment described previously. In this step, the tension of the probe card 65 is adjusted by adjusting the adjusting screw 78 so as to permit the probe card to be positioned in substantially a horizontal plane. The pushing load of the contact bump 65a is also controlled by operating the adjusting screw 78. Then, the semiconductor wafer 12 is fixed by a chuck (not shown) arranged on the table 13. Further, the table 13 is transferred by the transfer mechanism 14 and, then, moved upward so as to bring the electrode pads 12a of the semiconductor chips 12b into contact with the contact bumps 65a of the probe card 65. As a result, the probe card 65 and the semiconductor wafer 12 are aligned in a horizontal direction.

It should be noted that many semiconductor chips 12b, e.g., 64 chips 12b, are formed on a single semiconductor wafer 12. On the other hand, many contact bumps 65a are formed on the probe card 65 such that these contact bumps 65a may be positioned to face the semiconductor chips 12b of the semiconductor wafer 12. It follows that the transfer mechanism 14 serves to permit the contact bumps 65a and the corresponding semiconductor chips 12b to be positioned as desired. If the contact bumps 65a are brought into contact with the electrode pads 12a of the semiconductor chips 12b, the pushing sections 89 consisting of the elastomer layer 87 covering the back surface of the probe card 65 serve to impart an elastic urging force to all the corresponding contact bumps 65a.

Upon receipt of the urging force on the back surface, the probe card 65 is deformed to conform with a surface profile of the semiconductor wafer 12. In other words, a pushing force conforming with the surface profile of the semiconductor wafer 12 is imparted to the probe card 65. What should also be noted is that the Teflon sheet 90 interposed between the pushing sections 89 of the elastomer layer 87 and the probe card 65 facilitates the sliding of the pushing sections 89 in a lateral direction. In addition, the V-shaped groove 88 formed in the pushing member 85 permits the pushing sections 89 to be elastically deformed independently. It follows that the contact bumps 65a can be brought into contact without fail with the electrode pads 12a of the semiconductor wafer 12, even where the contact bumps are collectively brought into contact with the electrode pads 12a formed over a large area.

To reiterate, the ball 84 is mounted at the tip portion of the adjusting screw 78 of the pushing mechanism 64 such that the pushing member 85 is supported swingable about the ball 84. It follows that the bumps 65a can be brought into contact with the electrode pads 12a without fail even if the probe card 65 is inclined relative to the semiconductor wafer 12.

Further, the elastomer layer 87 is formed to cover the back surface of the probe card 65 so as to alleviate the impact generated when the bumps 65a are brought into contact with the electrode pads 12a. Naturally, it is possible to prevent damage done to the electrode pad 12a and the contact bump 65a, leading to an improved durability of the probe card 65.

Figure 9:
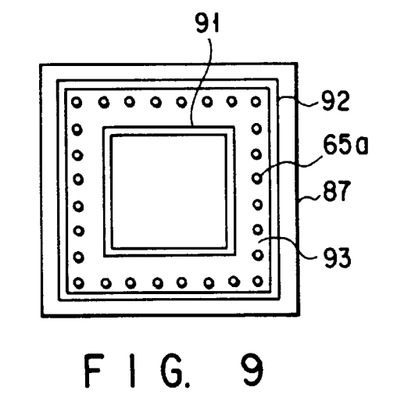
FIG. 9 is a plan view showing another example of the pushing member included in the probe card device of the present invention.

In the second embodiment described above, the groove 88 is formed in a lattice shape in the elastomer layer 87 so as to form the pushing sections 89. However, where a plurality of contact bumps 65a of the probe card 65 are arranged to form a frame-like single row as shown in FIG. 9, it is possible to form frame-like concentric grooves 91 and 92 in the elastomer layer 87. In this case, a frame-like pushing section 93 is formed to conform with the group of the frame-like contact bumps.

Figure 10:
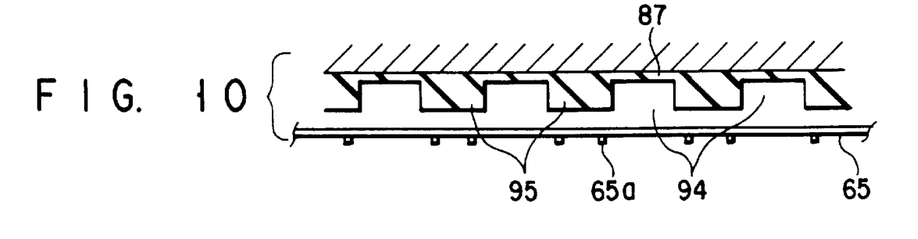
FIG. 10 is a vertical side view showing still another example of the pushing member included in the probe card device of the present invention.

Further, it is not absolutely necessary for the groove 88 formed in the elastomer layer 87 to have a V-shaped cross section. For example, it is possible to form a groove 94 having a U-shaped cross section in the elastomer layer 87 such that a pushing section 95 is surrounded by the groove 94, as shown in FIG. 10.

Still further, in the second embodiment, the probe card 65 is pushed by the pushing member 85 alone for imparting tension to the probe card 65. However, it is of course possible to use two different members for imparting tension to the probe card in two stages so as to make the tension uniform, as in the first embodiment described previously.

In addition to the two embodiments described above, the present invention can be modified in various other fashions. For example, in each of the first and second embodiments described above, a semiconductor wafer was used as an object to be tested. However, other objects such as a liquid crystal display substrate can be tested by the probing apparatus using the probe card device of the present invention.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A probe card device used in a probing apparatus for testing the electrical characteristics of an object to be tested having a plurality of electrode pads by bringing the electrode pads into contact with contact elements, comprising:

a probe card disposed to face said object, said probe card including a flexible and insulating membrane having a pushing region, a plurality of contact elements mounted in said pushing region of the membrane in a manner to correspond to a plurality of electrode pads of the object, and a wiring formed in said membrane for achieving an electrical contact between a tester of the probing apparatus and said contact elements;

a support member for supporting said probe card; and a pushing mechanism for pushing the back surface in the pushing region of the membrane included in the probe card toward the object;

wherein said pushing mechanism includes a pushing unit divided into a plurality of blocks to correspond to said pushing region and a support member for supporting each block, said plural blocks of said pushing member being independently movable, and the plural blocks serving to push the object in a manner to follow a surface profile of the object.

2. The probe card device according to claim 1, wherein said pushing mechanism comprises tension control means for controlling the tension of the probe card.

3. The probe card device according to claim 2, wherein said tension control means includes two tensing mechanisms causing the probe card to be tensed in two stages.

4. The probe card device according to claim 1, wherein said pushing mechanism comprises pushing load control means for controlling the pushing load of contact elements.

5. The probe card device according to claim 1, wherein said plural blocks of said pushing member are supported by said support unit with coil springs interposed therebetween.

6. The probe card device according to claim 1, wherein said plural blocks of said pushing member are supported by said support unit with leaf springs interposed therebetween.

7. The probe card device according to claim 1, wherein an elastic member is interposed between said probe card and said pushing member in a region corresponding to said pushing region of the membrane.

8. The probe card device according to claim 7, wherein said elastic member is formed of an elastomer.

9. The probe card device according to claim 1, wherein each of said contact elements is a bump.

10. The probe card device according to claim 1, wherein said pushing member is mounted swingable.

* * * * *